United States Patent [19]

Ando et al.

[11] Patent Number: 4,911,805
[45] Date of Patent: Mar. 27, 1990

[54] APPARATUS AND PROCESS FOR PRODUCING A STABLE BEAM OF FINE PARTICLES

[75] Inventors: Kenji Ando, Kawasaki; Yuji Chiba, Atsugi; Tatsuo Masaki, deceased, late of Yokohama, by Yoshiko Masaki, legal successor; Masao Sugata, Yokohama; Kuniji Osabe, Tama; Osamu Kamiya, Machida, all of Japan

[73] Assignee: Canon Kabushiki Kaisha, Tokyo, Japan

[21] Appl. No.: 52,148

[22] Filed: May 21, 1987

Related U.S. Application Data

[63] Continuation-in-part of Ser. No. 843,574, Mar. 25, 1986, abandoned:

[30] Foreign Application Priority Data

| Mar. 26, 1985 | [JP] | Japan | 60-59619 |
|---|---|---|---|
| Apr. 30, 1985 | [JP] | Japan | 60-91029 |
| Apr. 30, 1985 | [JP] | Japan | 60-91030 |
| May 10, 1985 | [JP] | Japan | 60-97696 |
| May 10, 1985 | [JP] | Japan | 60-97699 |
| May 10, 1985 | [JP] | Japan | 60-97700 |
| May 30, 1985 | [JP] | Japan | 60-115364 |
| May 30, 1985 | [JP] | Japan | 60-115365 |
| Jun. 12, 1985 | [JP] | Japan | 60-126147 |
| Jul. 10, 1985 | [JP] | Japan | 60-149992 |

[51] Int. Cl.$^4$ .................................... C25B 11/02
[52] U.S. Cl. .................. 204/164; 239/81; 219/121.47; 219/121.5; 219/121.52; 219/76.16; 219/121.43; 219/121.55; 204/157.41; 204/157.43; 204/157.61; 204/157.44; 204/157.63; 422/186.04; 422/186.21; 422/907; 427/34; 118/715; 118/719; 118/722
[58] Field of Search ............ 118/301, 308, 310, 315, 118/620, 621, 715, 719, 722, 723; 427/34, 38, 180, 195, 201, 252, 426; 239/80, 81, 85, 288, 499, 548, 589, 590.5, 597, 566; 219/121 PL, 121 PP, 121 PR, 121 PQ, 121 PG, 76.16; 406/123, 170, 194; 204/164

[56] References Cited

U.S. PATENT DOCUMENTS

| 2,175,160 | 10/1939 | Zobel et al. | 239/589 |
|---|---|---|---|
| 3,003,939 | 10/1961 | Rovy et al. | 204/164 |
| 3,005,762 | 10/1961 | Fenn | 204/164 |
| 3,010,009 | 11/1961 | Ducati | 219/121 PL |
| 3,075,065 | 1/1963 | Ducati et al. | 219/121 PP |
| 3,280,018 | 10/1966 | Denis | 204/164 |
| 3,507,294 | 4/1970 | Fix et al. | 137/81.5 |
| 3,556,409 | 1/1971 | Johannisson | 239/433 |
| 3,670,400 | 6/1972 | Singer | 29/527.5 |
| 3,771,473 | 11/1973 | Borgnat et al. | 110/182.5 |
| 3,801,346 | 4/1974 | Melton, Jr. et al. | 239/85 X |
| 3,839,618 | 10/1974 | Muehlberger | 219/121 PL |
| 3,904,505 | 9/1975 | Aisenberg | 204/298 |
| 3,914,573 | 10/1975 | Muehlberger | 219/121 PP |
| 4,006,340 | 2/1977 | Gorinas | 219/121 PL |
| 4,199,104 | 4/1980 | Houben | 239/85 X |
| 4,200,264 | 4/1980 | Hori | 266/149 |

(List continued on next page.)

FOREIGN PATENT DOCUMENTS 0049915 4/1982 European Pat. Off. ..
(List continued on next page.)

OTHER PUBLICATIONS

Spurk, J. H.; Vorlesung Strömungslehre II, Darmstadt, Technical University Darmstadt, 1974, pp. 0-6 to 0-9 and 2-154 to 2-175.

(List continued on next page.)

Primary Examiner—Shrive P. Beck
Assistant Examiner—Alain Bashore
Attorney, Agent, or Firm—Fitzpatrick Cella Harper & Scinto

[57] ABSTRACT

An apparatus for controlling a flow of fine particles is provided which comprises a convergent-divergent nozzle in a flow path of the fine particles. The nozzle may be operated under an optimum expansion condition, and the differential coefficient of the streamline at the channel inside the nozzle varies continuously and is equal to zero at a throat portion of the nozzle.

25 Claims, 7 Drawing Sheets

U.S. PATENT DOCUMENTS

| | | | |
|---|---|---|---|
| 4,231,518 | 11/1980 | Zverev et al. | 239/85 X |
| 4,275,287 | 6/1981 | Hiratake | 219/121.52 |
| 4,297,971 | 11/1981 | Henery | 118/719 |
| 4,389,973 | 6/1983 | Suntola et al. | 118/725 |
| 4,540,121 | 9/1985 | Browning | 219/121 PL |
| 4,603,810 | 8/1986 | Schleimer et al. | 239/589 X |
| 4,724,106 | 3/1988 | Morimoto et al. | 427/38 X |

FOREIGN PATENT DOCUMENTS

| | | |
|---|---|---|
| 0064288 | 11/1982 | European Pat. Off. . |
| 811900 | 8/1951 | Fed. Rep. of Germany . |
| 2843408 | 2/1980 | Fed. Rep. of Germany . |
| 3148756 | 7/1983 | Fed. Rep. of Germany . |
| 544737 | 9/1922 | France . |
| 1148292 | 12/1957 | France . |
| 14034306 | 5/1965 | France . |
| 1518843 | 2/1968 | France . |
| 1537320 | 7/1968 | France . |
| 2108856 | 5/1972 | France . |
| 2122682 | 9/1972 | France . |
| 2288282 | 5/1976 | France . |
| 2443137 | 6/1980 | France . |
| 58-58276 | 4/1983 | Japan . |
| 222209 | 9/1924 | United Kingdom . |
| 415446 | 8/1934 | United Kingdom . |
| 721364 | 1/1955 | United Kingdom . |
| 891159 | 3/1962 | United Kingdom . |
| 1057120 | 2/1967 | United Kingdom . |
| 1092534 | 11/1967 | United Kingdom . |
| 1151164 | 5/1969 | United Kingdom . |
| 1155495 | 10/1969 | United Kingdom . |
| 1166495 | 10/1969 | United Kingdom . |
| 1336253 | 11/1973 | United Kingdom . |
| 1342994 | 1/1974 | United Kingdom . |
| 2007388 | 5/1979 | United Kingdom . |
| 2123981 | 2/1982 | United Kingdom . |

OTHER PUBLICATIONS

Landau, L. D., Litschutz, E. M., Lehrbuchder theoretishen Physik, Hydrodynamik, vol. VI, Berlin, Akademie-Verlag, 1981, pp. 403–408.

English equivalent abstract with drawing figure for Japanese application (KOKAI) 58-58276 published 4-6-83.

English equivalent abstract with Drawing Figure for Japanese Application (KOKAI) 59-56504 published 4-2-84.

APPARATUS AND PROCESS FOR PRODUCING A STABLE BEAM OF FINE PARTICLES

This application is a continuation-in-part of application Ser. No. 843,574 filed Mar. 25, 1986, now abandoned.

BACKGROUND OF THE INVENTION

1. Field of the Invention

The present invention relates to an apparatus for controlling a flow of fine particles, employed for transportation or blowing of fine particles and adaptable to film forming, formation of composite material, doping etc. with fine particles, or a field of fine particle formation.

In the present specification, the fine particles include atoms molecules, ultra-fine particles and general fine particles. The ultra-fine particles mean those generally smaller than 0.5 $\mu$m, obtained for example by evaporation in gas, plasma evaporation, chemical vapor reaction, colloidal precipitation in a liquid or pyrolysis of liquid spray. The general fine particles mean fine particles obtained by ordinary methods such as mechanical crushing, crystallization or precipitation. A beam means a flow with a substantially constant cross section along the flow direction independently of the geometry of said cross section.

2. Description of the Related Art

In general, fine particles are dispersed and suspended in a carrier gas and are transported by the flow of said carrier gas.

Conventionally, the control of flow of fine particles in the transportation thereof has merely been achieved by defining the entire flow of the fine particles flowing together with the carrier gas by means of a pipe or a casing, utilizing the pressure difference between the upstream and downstream sides. Consequently the flow of fine particles is inevitably dispersed over the entire pipe or casing defining the flow path, though there is certain distribution in the flow.

In case of blowing the fine particles to a substrate, they are generally ejected with carrier gas from a nozzle. The nozzle employed in such fine particle blowing is a straight or convergent nozzle, and the cross section of the flow of fine particles immediately after the ejection is constricted according to the area of the nozzle outlet. However the flow is at the same time diffused at the nozzle outlet, so that said constriction is only temporary and the flow velocity does not exceed acoustic velocity.

In case of defining the entire flow path of fine particles with a pipe or a casing and of transporting the fine particles with carrier gas along said flow path by means of the pressure difference between the upstream and downstream sides, as gas flow-out at the downstream side for generating said pressure difference not only induces the flow-out of fine particles but also is unable to achieve a very high transport velocity. Also the fine particles inevitably contact the walls of the pipe or casing defining the flow path over the entire course of transportation. Therefore, in case of transporting active fine particles to a desired site, there may result a loss in activity by the time elapsed in said transportation or by contact with the walls of the pipe or casing. Also the defining of the entire flow path of fine particles with a pipe or casing may result, for example by the formation of a dead space in the flow, in a lowered trapping rate of the fine particles and a lowered utilization efficiency of the carrier gas for fine particle transportation.

On the other hand, the conventional straight or convergent nozzle generates a diffused flow in which the fine particles show a broad distribution in density. Therefore, in case of flowing fine particles onto a substrate, it is difficult to achieve uniform blowing and to control the area in which such uniform blowing is obtained.

The U.S. Pat. No. 4,200,264 discloses an apparatus for producing metallic Mg or Ca by carbon reduction method.

In said apparatus, a reduction reaction is caused by heating an oxide of Mg or Ca with carbon in a reaction chamber, and the resulting gaseous mixture is introduced into a divergent nozzle to cause adiabatic expansion for cooling thereby obtaining fine particles of Mg or Ca.

The divergent nozzle employed in said patent is limited to that functioning under an under-expansion condition.

The use of such nozzle under such condition certainly allows to create an supersonic velocity in the passing gas, but the passing gas flow is diffused at the nozzle orifice so that a flow with a substantially constant cross section cannot be obtained.

Consequently there results a low trapping yield in case of trapping the resulting fine particles for example on a substrate

SUMMARY OF THE INVENTION

The present invention is to overcome the aboveexplained problems.

More specifically, an object of the present invention is to provide a flow control apparatus and a flow control process for generating a flow of fine particles with a substantially constant cross section and with minimum diffusion.

Another object of the present invention is to provide a flow control apparatus and a flow control process enabling efficient trapping of fine particles of a limited life, for example active fine particles, without loss in activity thereof.

The above-mentioned objects can be achieved by the present invention as will be explained in the following.

More specifically, the present invention provides an apparatus for controlling a flow of fine particles, comprising a convergent-divergent nozzle in a flow path.

The present invention also provides an apparatus for controlling a flow of fine particles, comprising a convergent-divergent nozzle in the flow path having a gas exciting means in the upstream side.

The present invention further provides an apparatus for controlling a flow of fine particles, comprising a convergent-divergent nozzle in a flow path which is evacuated at the downstream side, wherein a cross section of the throat of said nozzle is so determined that a flow rate a said nozzle is approximately equal to the rate of the evacuation.

The present invention further provides a process for controlling a flow of fine particles which comprises evacuating the downstream side of a convergent-divergent nozzle provided in a flow path thereby casing the fine particles to pass through said nozzle.

The present invention further provides a process for controlling a flow of fine particles which comprises maintaining an upstream side, of a convergent-divergent nozzle provided in a flow path, at a pressure equal to or higher than an atmospheric pressure

DETAILED DESCRIPTION OF THE PREFERRED EMBODIMENTS

Figure 1:
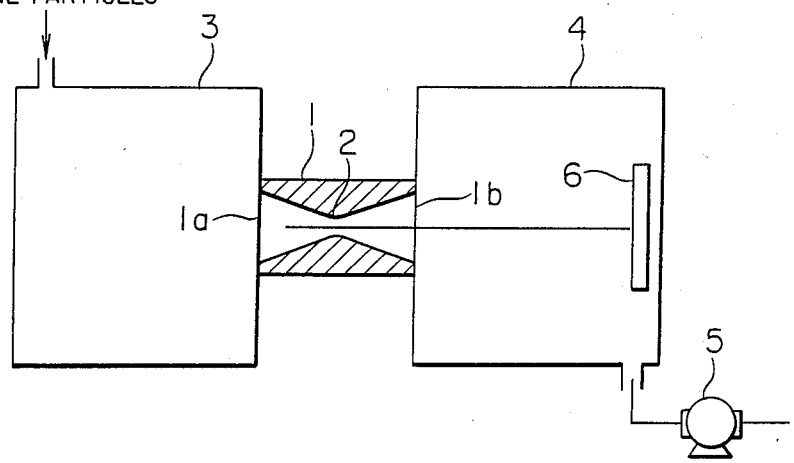
FIG. 1 is a schematic view showing the basic principle of the present invention.

A convergent-divergent nozzle 1 employed in the present invention has an aperture cross section which, as shown in FIG. 1, is gradually reduced from an inlet 1a to an intermediate throat 2 and is then gradually enlarged toward an outlet 1b. For the convenience of explanation, in FIG. 1, the inlet and outlet of the convergent-divergent nozzle 1 are respectively connected to a closed upstream chamber 3 and a closed downstream chamber 4. However, the inlet and outlet of the convergent-divergent nozzle 1 of the present invention may be connected to closed or open systems as long as the fine particles are caused to pass together with carrier gas by a pressure difference therebetween.

An optimum expansion condition in the present invention means that the pressure $P_1$ at the nozzle outlet 1b is equal to the pressure P in the downstream chamber 4, whereby the flow from the nozzle has a beam characteristic.

Under an underexpansion condition $P_1 > P$, the ejected flow rapidly diverges toward the outside, starting from the outlet of the nozzle, so that a uniform flow cannot be obtained. On the other hand, under an over expansion condition $P_1 < P$, the flow is liable to cause peeling-off in the nozzle, thus becoming unstable, and also tends to grow a shock wave and being not suitable for the present purpose. For obtaining an optimum expansion flow, pressure sensors for instance may be provided at or around the outlet of the nozzle and the downstream chamber respectively, and $P_0$ at the upstream portion and P at the downstream portion is controlled so that the pressures detected by the sensors may be approximately equal to each other.

In the present invention, a pressure difference between the upstream chamber 3 and the downstream chamber 4 is generated, as shown in FIG. 1, by supplying the upstream chamber 3 with carrier gas in which the fine particles are dispersed in a suspension state, and evacuating the downstream chamber 4 with a vacuum pump 5, whereby tee supplied carrier gas containing the fine particles flows from the upstream chamber 3 to the downstream chamber 4 through the convergent-divergent nozzle 1.

The convergent-divergent nozzle 1 performs functions not only of ejecting the fine particles together with carrier gas according to the pressure difference between the upstream and downstream sides, but also of rendering the ejected flow of carrier gas and fine particles uniform. Such uniform flow of fine particles can be utilized for blowing the fine particles uniformly onto a substrate 6.

The convergent-divergent nozzle 1 is capable of accelerating the flow of fine particles ejected with the carrier gas, by suitable selection of a pressure ratio $P/P_0$ of the pressure P in the downstream chamber 4 to the pressure $P_0$ in the upstream chamber, and a ratio $A/A^*$ of the aperture cross-sectional area A of the outlet 1*b* to that $A^*$ of the throat 2. If said ratio $P/P_0$ of the pressures in the upstream and downstream chambers 3, 4 is larger than a critical ratio of pressure, the mass flow velocity at the outlet of the nozzle 1 becomes subsonic or less, and the mixture of the fine particles and the carrier gas are ejected at a reduced velocity. On the other hand, if said pressure ratio $P/P_0$ is less than the critical ratio of pressure, said mass flow velocity at the outlet becomes supersonic, so that the fine particles and the carrier gas are ejected at an supersonic velocity.

If the flow of the fine particles is assumed to a compressive one-dimensional flow with adiabatic expansion, the Mach number M that can be reached by the flow is determined by the pressure $P_0$ of the upstream chamber and the pressure P of the downstream chamber, according to a following formula:

$$M = \frac{u}{a} = \left[\left(\frac{P_0}{P}\right)^{\frac{\gamma-1}{\gamma}} - 1\right]_{\frac{2}{\gamma-1}} \quad (1)$$

wherein u is the velocity of the fluid, a is the local acoustic velocity at the outlet, and $\gamma$ is the ratio of specific heats of said fluid; and M exceeds 1 when the ratio $P/P_0$ is below the critical ratio of pressure.

The acoustic velocity a can be determined by the formula:

$$a = \sqrt{\gamma RT}$$

wherein T is the local temperature and R is gas constant. Also there stands a following relation among the aperture cross sections A, $A^*$ of the outlet 1*b* and throat 2, and the Mach number M:

$$\frac{A}{A^*} = \frac{1}{M}\left[\frac{2}{\gamma+1}\left(1 + \frac{\gamma-1}{2}M^2\right)\right]^{\frac{\gamma+1}{2(\gamma+1)}} \quad (2)$$

It is therefore possible to regulate the velocity of the flow of fine particles ejected from the nozzle 1, by selecting the aperture ratio $A/A^*$ according to the Mach number M determined by the equation (1) from the pressure ratio $P/P_0$ of the upstream and downstream chambers, or by regulating said ratio $P/P_0$ according to the value of M determined by the equation (2) from the aperture ratio $A/A^*$. The velocity u of the flow of fine particles can be determined by a following equation (3):

$$u = M\sqrt{\gamma RT_0}\left(1 + \frac{\gamma-1}{2}M^2\right)^{\frac{1}{2}} \quad (3)$$

wherein $T_0$ represents the temperature of the upstream chamber 3.

The state of flow of the fine particles can be maintained t a state determined by the aperture area ratio $A/A^*$, if the pressure ratio $P/P_0$ of the upstream chamber 3 and the downstream chamber 4 is maintained constant. Accordingly the vacuum pump 5 for evacuating the downstream side or the downstream chamber 4 has to be able to maintain said chamber 4 at a constant pressure independently of the inflow of the fine particles through the convergent-divergent nozzle 1, if the upstream chamber 3 is maintained at a constant pressure.

The mass that can be evacuated by a vacuum pump generally depends on the capacity of said pump. However, if the flow rate through nozzle is selected smaller than the evacuation rate of the pump, the pressure in the downstream chamber 4 can be maintained constant by regulating the flow rate through the pump substantially equal to the flow rate of the nozzle, for example with a valve. Particularly by selecting the cross-sectional area of the throat 2 of the convergent-divergent nozzle 1 in such a manner that the flow rate through said nozzle 1 becomes equal to the effective evacuation rate of the pump, the flow of the fine particles is subjected to optimum expansion at the nozzle outlet 1b without the regulation of flow velocity by the valve or the like, and a maximum flow velocity within the performance of the pump can be stably obtained.

The flow rat through the nozzle and the flow rate of evacuation are represented by mass flow rate respectively.

The mass flow rate m in the convergent-divergent nozzle 1 is determined by the following equation (4):

$$m = P_0 \left( \frac{\gamma}{RT_0} \right) \left( \frac{2}{\gamma+1} \right)^{\frac{\gamma+1}{2(\gamma-1)}} \cdot A^* \quad (4)$$

and is determined by the aperture cross-sectional area $A^*$ of the throat 2 if the pressure $P_0$ and temperature $T_0$ of the upstream chamber 3 are constant.

In an ejection with a pressure ratio exceeding the critical ratio as explained above, the ejected carrier gas and fine particles form a uniform diffusing flow, so that the fine particles can be blown uniformly over a relatively wide area.

On the other hand, the carrier gas and fine particles, if ejected in a direction in the form of an high speed flow, constitute a beam, substantially maintaining the cross section immediately after the ejection. Consequently the fine particles, transported by said carrier gas, also constitute a beam which is transported at a high speed in the downstream chamber 4, with minimum diffusion and spatially without interference with the walls of the downstream chamber 4, so that the evacuation of the fine particles by the pump 5 can be easily prevented.

It is therefore rendered possible to capture active fine particles on the substrate 6 in the downstream chamber 4 in satisfactory active state, by generating said active fine particles in the upstream chamber 3 and transporting said particles through the nozzle 1, or by generating said active fine particles in or immediately after said nozzle 1 and transporting said particles, in the form of a spatially independent supersonic beam. Also the region of capture can be easily controlled since the fine particle are blown onto the substrate 6 in the form of a beam with a cross section substantially constant along the flow.

The "beam" in the present invention means a jet stream flowing with directivity in one direction and with a higher density than that of surrounding space irrespective of the shape of the section of the stream.

When the jet stream comprises molecular particles, the beam characteristics can be detected by measuring the stream intensity of flying molecules by means of an orifice connected to a differential evacuation system of a mass spectrometer and moving perpendicularly across the beam.

With a nozzle having a circular cross section, the output from the mass spectrometer reaches the maximum value at the center of the beam. The output value will decrease gradually with the distance from the center. The distance between the center of the beam and the point where the detected value has decreased to half the maximum output is measured above.

The divergence of the beam is evaluated by the divergence angle of the beam defined by the formula below:

$$\theta = \mathrm{Tan}^{-1} \tfrac{1}{2} \{ (d_2 - d_1)/(l_2 - l_1) \}$$

where $d_1$ denotes the beam diameter at a distance $l_1$ from the exit of the nozzle to downstream direction, and $d_2$ at the distance $l_2$.

The desirable $\theta$ value depends on the application field and the size restriction N t is generally not more than $\pi/6$, preferably $\pi/12$, and more preferably $\pi/18$. With a nozzle of non-circular nozzle section, the divergence angle can be defined correspondingly to the above definition of $\theta$.

For ultra-fine particles, the divergence of the beam can be evaluated from $\theta$ value be means of a laser doppler velocimeter or photon correlation spectroscopy employing the technology of light-scattering spectroscopy.

Figure 2:
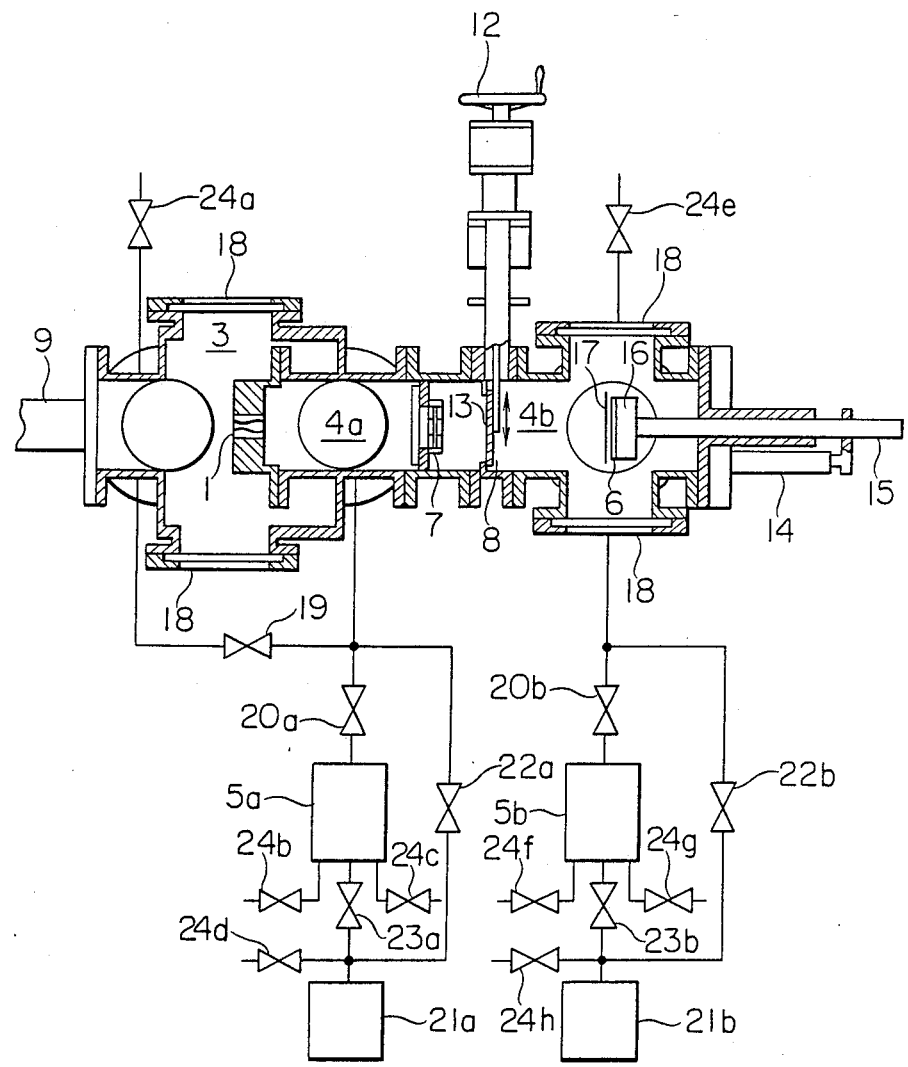
FIG. 2 is a schematic view of a film-forming apparatus with ultra-fine particles embodying the present invention.

FIG. 2 schematically show an embodiment in which the present invention is applied to an apparatus for film formation with ultra-fine particles, wherein illustrated are a convergent-divergent nozzle 1; an upstream chamber 3; a first downstream chamber 4a; and a second downstream chamber 4b.

The upstream chamber 3 and the first downstream chamber 4a are constructed as an integral unit, and, to said first downstream chamber 4a, there are detachably connected a skimmer 7, a gate valve 8 and the second downstream chamber 4b in similar unit structures, through flanges of a common diameter, which will hereinafter be referred to as common flanges. The upstream chamber 3, first downstream chamber 4a and second downstream chamber 4b are maintained at successively higher degrees of vacuum by a vacuum system to be explained later.

To a side of the upstream chamber 3 there is connected, by a common flange, a gas exciting means 9 which generates active ultra-fine particles by plasma and sends said particles to the confronting convergent-divergent nozzle 1, together with carrier gas such as hydrogen, helium, argon or nitrogen. The upstream chamber 3 may be provided with an anti-adhesion treatment on the inner walls thereof, in order to prevent the adhesion of thus generated ultra-fine particles onto said inner walls. Due to the pressure difference between the upstream chamber 3 and the first downstream chamber 4a caused by the higher degree of vacuum in the latter, the generated ultra-fine particles flow, together with said carrier gas, through the nozzle 1 to the first downstream chamber 4a.

Figure 3A:
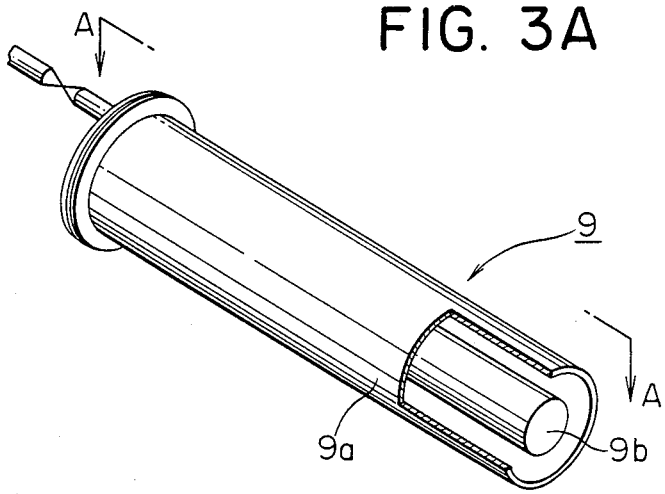
FIGS. 3A, 3B, 4A, 4B, 5A and 5B are views showing embodiments of gas exciting means.
Figure 3B:
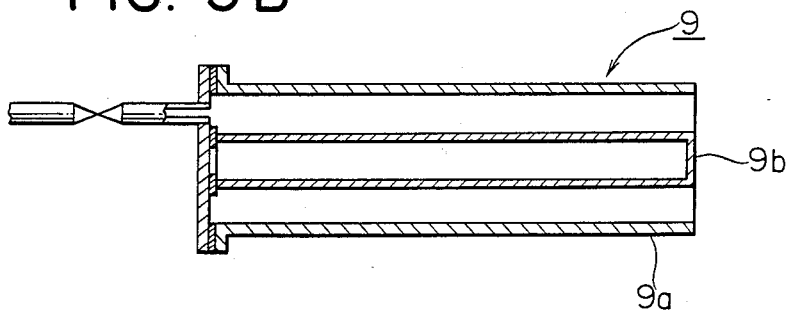
Figure 4A:
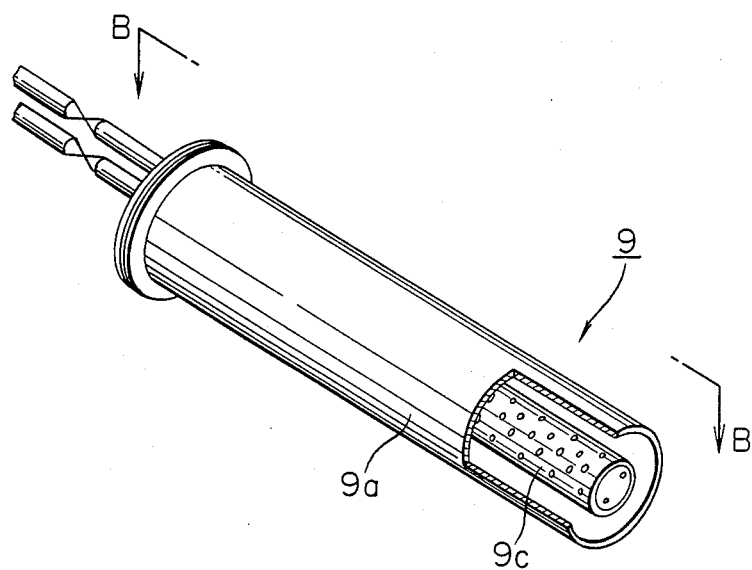
Figure 4B:
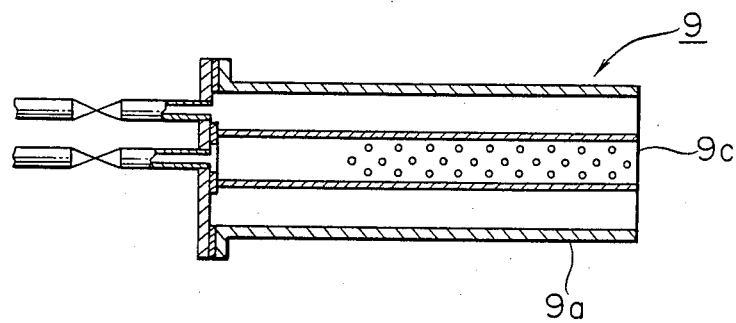

As shown in FIGS. 3A and 3B, the gas exciting means 9 comprises a tubular first electrode 9a incorporating a rod-shaped second electrode 9b to induce an electric discharge therebetween, while the carrier gas and the raw material gas are supplied into said first electrode 9a. Examples of gas exciting method employable in the present invention are DC glow discharge and high-frequency glow discharge. Also in the gas exciting means 9, as shown in FIGS. 4A and 4B, the first electrode 9a may incorporate a second electrode 9c with plural pores whereby the carrier gas is supplied inside the first electrode 9a while the raw material gas is supplied inside the second electrode 9c. Such structure allows gas excitation while the carrier gas and the raw material gas are uniformly mixed in the tube.

Figure 5A:
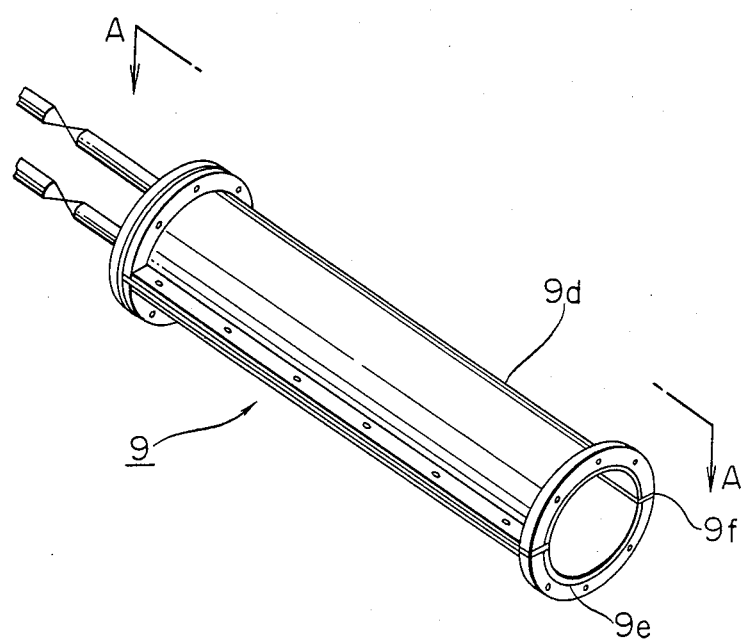
Figure 5B:
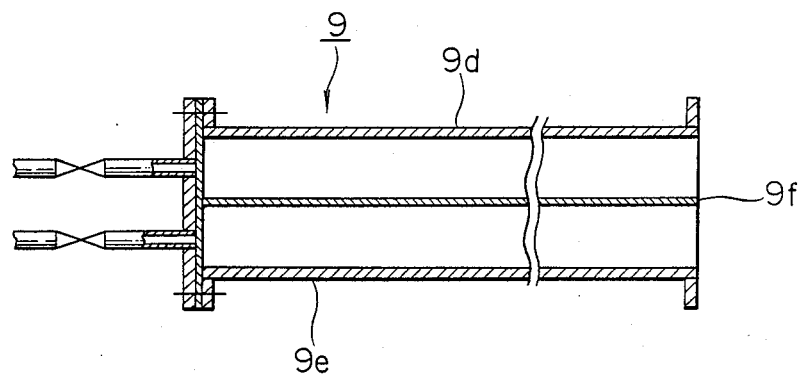

FIG. 5A is perspective view of another example of the gas exciting means, and FIG. 5B is a cross sectional view along a line A—A. As illustrated, a semi-circular first electrode 9d and a second electrode 9e of a similar structure are assembled through insulators 9f composed for example of quartz or porcelain, and supply pipes for the carrier gas and raw material gas are connected through a common flange.

The convergent-divergent nozzle 1 is mounted, by a common flange, on a lateral end of the first downstream chamber 4a directed toward the upstream chamber 3 so as to protrude in the upstream chamber 3, with the inlet 1a opened in said upstream chamber 3 and the outlet 1b opened in said first downstream chamber 4a. Said nozzle 1 may also be mounted so as to protrude in the first downstream chamber 4a. The protruding direction of the nozzle 1 is determined according to the size, quantity and nature of the ultra-fine particle to be transported.

As explained before, the cross section of the convergent-divergent nozzle 1 is gradually reduced from the inlet 1a to the throat 2, and is then gradually expanded to the outlet 1b, and the differential coefficient of the curve of flow path changes continuously and reaches zero at the throat 2, thereby minimizing the growth of flow boundary layers in the nozzle 1. In the present invention, the curve of flow path in the nozzle 1 means the curve of the internal wall on a cross-section along the direction of flow. In this manner it is rendered possible to select the effective cross section of the flow in the nozzle 1 close to the designed value and to fully exploit the performance of the nozzle 1. As shown in a magnified view in FIG. 6A, the internal periphery in the vicinity of the outlet 1b is preferably substantially parallel to the central axis, or, has a differential coefficient equal to zero, in order to facilitate the formation of a parallel flow, since the direction of flow of the ejected carrier gas and fine particles is affected, to a certain extent, by the direction of the internal periphery in the vicinity of the outlet 1b. However, if the angle $\alpha$ of the internal wall from the throat 2 to the outlet 1b with respect to the central axis is selected smaller than 7°, preferably 5° or less as shown in FIG. 6B, it is possible to prevent the peeling-off phenomenon and to maintain a substantially uniform state in the ejected carrier gas and ultra-fine particles. Consequently, in such a case, the above-mentioned parallel internal peripheral wall can be dispensed with, and the manufacture of the nozzle 1 can be facilitated by the elimination of said parallel wall portion. Also a slit-shaped ejection of the carrier gas and ultra-fine particles can be obtained by employing a rectangular nozzle 1 as shown in FIG. 6C.

The above-mentioned peeling-off phenomenon means a formation of an enlarged boundary layer between the internal wall of the nozzle 1 and the passing fluid, caused for example by a projection on said internal wall, giving rise to an uneven flow, and such phenomenon tends to occur more frequently in the flow of a higher velocity In order to prevent such peeling-off phenomenon, the aforementioned angle $\alpha$ is preferably selected smaller when the internal wall of the nozzle 1 is finished less precisely. The internal wall of the nozzle 1 should be finished with a precision indicated by three, preferably four, inverted triangle marks as defined in the JIS B 0601. Since the peeling-off phenomenon in the divergent portion of the nozzle 1 significantly affects the flow of carrier gas and ultra-fine particles thereafter, the emphasis on the surface finishing should be given to said divergent portion, in order to facilitate the fabrication of the nozzle 1. Also for preventing said peeling-off phenomenon, it is necessary to form the throat portion 2 with a smooth curve and to avoid the presence of an infinitely large differential coefficient in the change rate of the cross-sectional area.

However, the growth of a boundary layer caused by said peeling-off phenomenon is unavoidable, since it is practically impossible to finish the internal wall of the nozzle 1 as a completely mirror surface. Growth of such boundary layer in the downstream side of the throat 2 corresponds to a reduction in the ratio $A/A^*$, thus not giving the desired flow velocity. For this reason, the effective cross-sectional area of the outlet is equal to the cross sectional area of the outlet minus the total area of said boundary layer at the outlet, is preferably at least equal to 90% of said cross-sectional area of the outlet.

Thus, the thickness of said boundary layer should not exceed ca. 0.5 mm for an outlet of 20 mm$\phi$, or ca. 0.05 mm for an exit of 2 mm$\phi$. Since said thickness cannot be made less than a certain lower limit, the diameter of the outlet 1b, in case of a circular outlet, should be at least 1 mm, and the gap of the outlet 1b, in case of a rectangular outlet, should be at least ca. 1 mm. The upper limit depends for example on the capacity of the vacuum pump 5 at the downstream side. Also the streamline of the flow should coincide with the curve of the internal wall of the nozzle 1 as far as possible, since otherwise the aforementioned boundary layer becomes thicker.

Figure 6A:
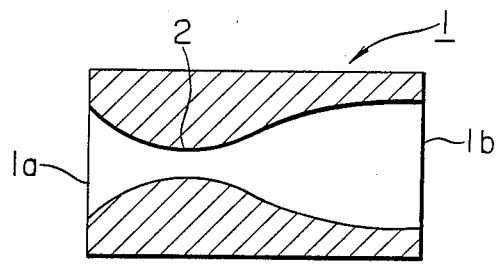
FIGS. 6A to 6D are views showing different shapes of the convergent-divergent nozzle.
Figure 6B:
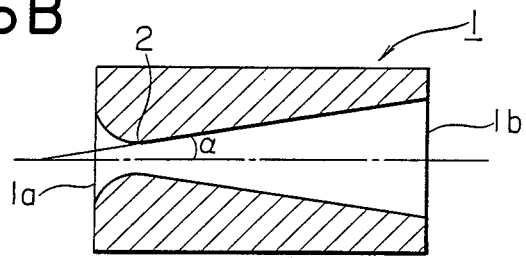
Figure 6C:
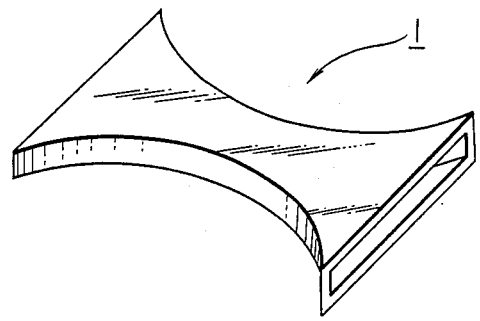
Figure 6D:
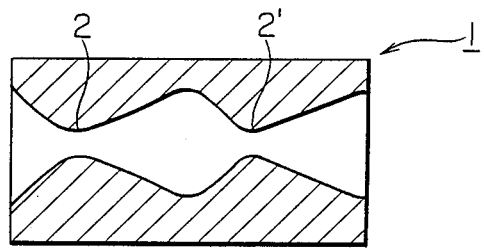

In addition to the forms shown in FIGS. 6A, 6B and 6C, the convergent-divergent nozzle 1 may be provided with plural throats 2, 2' as shown in FIG. 6D. In such case the flow accelerated on passing the first throat 2 is decelerated in a diameter decreasing portion, and again accelerated at the second throat 2'. In such structure the temperature of the flow rises and falls repeatedly, corresponding to the change in velocity in the nozzle 1, by the mutual conversion of the thermal energy and the kinetic energy as will be explained later, and there can therefore be formed an interesting reaction field. The number of throats is not limited to two but can be increased to three or more.

Examples of the material of the convergent-divergent nozzle 1 include metals such as iron and stainless steel, plastics such as acrylic resin, polyvinyl chloride, polyethylene, polystyrene and polypropylene, ceramic materials, quartz, glass etc. Said material can be selected in consideration of absence of reaction with the ultra-fine particles to be generated, ease of mechanical working, gas emission in the vacuum system. Also the internal wall of the nozzle 1 may be plated or coated with a material that prevents adhesion of or reaction with the ultra-fine particles. An example of such material is polyfluoroethylene coating.

The length of the convergent-divergent nozzle 1 can be arbitrarily decided, in consideration, for example, of the length of the apparatus. The thermal energy possessed by the carrier gas is converted to a kinetic energy as the carrier gas passes through the convergent-divergent nozzle. Accordingly, the thermal energy of the ultra-fine particles is also decreased remarkably and the flow velocity of the ultra-fine particles follows that of the carrier gas. Further the cooling effect caused by the above-mentioned thermal energy decrease may condense a condensable gas in the flow if it is contained in the carrier gas, whereby formation of ultra-fine particles is made possible Such method allows to obtain homogeneous ultra-fine particles, due to the homogeneous nucleation. Also in such case, the convergent-divergent nozzle 1 should preferably be longer for achieving sufficient condensation. On the other hand, such condensation increases the thermal energy and reduces the kinetic energy. Consequently, in order to maintain high-speed ejection, the nozzle 1 should preferably be shorter.

By passing the flow of carrier gas, containing ultra-fine particles through the aforementioned convergent-divergent nozzle 1, with an appropriate selection of the pressure ratio $P/P_0$ of the upstream chamber 3 and the downstream chamber 4 and of an aperture area ratio $A/A^*$ of the throat 2 and the outlet 1b, said flow is formed as a beam, flowing at a high speed from the first downstream chamber 4a to the second downstream chamber 4b.

Figure 7A:
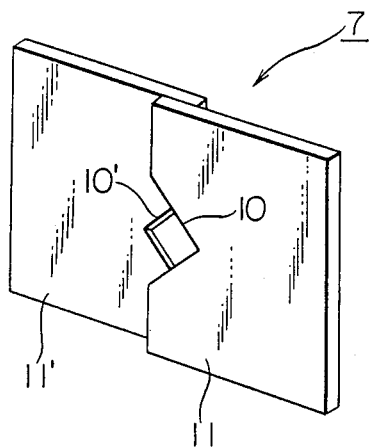
FIGS. 7A and 7B are views of different examples of a skimmer.

The skimmer 7 is a variable aperture which can be externally regulated to stepwise vary the area of the aperture between the first downstream chamber 4a and the second downstream chamber 4b, in order to maintain a higher degeee of vacuum in the second downstream chamber 4b than in the first 4a. More specifically, said skimmer is composed, as shown in FIG. 7A, of two adjusting plates 11, 11' which are respectively provided with notches 10, 10' and which are slidably positioned in such a manner that said notches 10, 10' mutually oppose Said adjusting plates 11, 11' can be moved externally, and the notches 10, 10' cooperate each other to define an aperture which allows the beam to pass and still is capable of maintaining a sufficient degree of vacuum in the second downstream chamber. Also the shape of the notches 10, 10' of the skimmer 7 and of the adjusting plates 11, 11' is not limited to the foregoing V-shape shown in FIG. 7A but may be semicircular or otherwise.

Figure 7B:
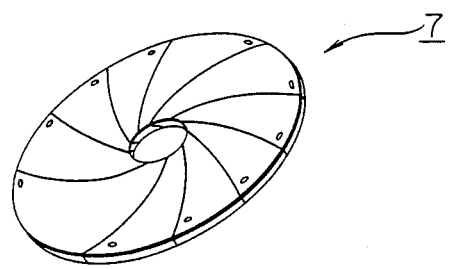

Furthermore there may be employed a diaphragm mechanism similar to that employed in a camera, as shown in FIG. 7B, and such mechanism enables delicate pressure control.

The gate valve 8 is provided with a dam-shaped valve member 13 opened or closed by a handle 12, and is fully opened when the beam flows. By closing said gate valve 8, it is rendered possible to exchange the unit of the second downstream chamber 4b while maintaining the upstream chamber 3 and the first downstream chamber 4a in vacuum state. In case the ultra-fine particles are easily oxidizable metal particles, it is rendered possible to replace the unit without danger of rapid oxidation by employing a ball valve or the like as said gate valve 8 and replacing the second downstream chamber 4b together with said ball valve In the second downstream chamber 4b, there is provided a substrate 6 for capturing the ultra-fine particles, transported in the form of a beam, as a film. Said substrate is mounted on a substrate holder 16 at an end of a sliding shaft 15 which is mounted in the second downstream chamber 4b through a common flange and is moved by a cylinder 14. In front of the substrate 6 there is provided a shutter 17 for intercepting the beam when required Also the substrate holder 16 is capable of heating or cooling the substrate 6 to an optimum condition for capturing the ultrafine particles.

On the top and bottom walls of the upstream chamber 3 and the second downstream chamber 4b, glass windows 18 ar mounted by common flanges as illustrated for enabling observation of the interior Though not illustrated, similar glass windows are mounted by common flanges on the front and rear walls of the upstream chamber 3, first downstream chamber 4a and second downstream chamber 4b. These glass windows, when removed, may be utilized for mounting various measuring instruments or a load lock chamber through the common flanges.

In the following there will be explained a vacuum system to be employed in the present embodiment.

The upstream chamber 3 is connected to a main valve 20a through a pressure regulating valve 19. The first downstream chamber 4a is directly connected to the main valve 20a, which is in turn connected to a vacuum pump 5a. The second downstream chamber 4b is connected to a main valve 20b which is connected to a vacuum valve 5b. Rough pumps 21a, 21b are respectively connected to the upstream side of the main valves 20a, 20b through preliminary vacuum valves 22a, 22b, and are also connected to the vacuum pumps 5a, 5b through auxiliary valves 23a, 23b. Said rough pumps 21a, 21b are used for preliminary evacuation of the upstream chamber 3, first downstream chamber 4a and second downstream chamber 4b. Leak/purge valves 24a–24h are provided for the chambers 3, 4a, 4b and pumps 5a, 5b, 21a, 21b.

At first the preliminary vacuum valves 22a, 22b and the pressure regulating valve 19 are opened to effect preliminary evacuation of the upstream chamber 3 and first and second downstream chambers 4a, 4b by means of the rough pumps 21a, 21b. Then the preliminary vacuum valves 22a, 22b are closed and the auxiliary valves 23a, 23b and the main valves 20a, 20b are opened to sufficiently evacuate the upstream chamber 3 and the first and second downstream chambers 4a, 4b by the vacuum pumps 5a, 5b. In this state the opening of the pressure regulating valve 19 is controlled to achieve a higher degree of vacuum in the first downstream chamber 4a than in the upstream chamber 3, then the carrier gas and the raw material gas are supplied and the skimmer 7 is regulated to achieve a still higher degree of vacuum in the second downstream chamber 4b than in the first downstream chamber 4a. Said regulation can also be achieved by the main valve 20b. Further control is made in such a manner that each of the chambers 3, 4a, 4b is maintained at a constant degree of vacuum throughout the generation of ultra-fine particles and the film formation by beam ejection. Said control can be achieved either manually or automatically by detecting the pressures in the chambers 3, 4a, 4b and accordingly driving the pressure regulating valve 19, main valves 20a, 20b and skimmer 7. Also if the carrier gas and the fine particles supplied to the upstream chamber 3 are immediately transported to the downstream side through the nozzle 1, the evacuation during the transportation can be made only in the first and second downstream chambers 4a, 4b.

The upstream chamber 3 and the first downstream chamber 4a may be provided with separate vacuum pumps for the above-mentioned vacuum control. However, if a single vacuum pump 5a is employed, as explained above, for evacuation in the direction of beam flow to control the degrees of vacuum in the upstream chamber 3 and the first downstream chamber 4a, the pressure difference therebetween can be maintained constant even when the vacuum pump 5a has certain pulsation. It is therefore made easier to maintain a constant flow state, which is easily affected by a change in the pressure difference.

The suction by the vacuum pumps 5a, 5b is preferably from upside, particularly in the first and second downstream chambers 4a, 4b since such suction from upside will prevent, to a certain extent, the descent of beam by gravity.

The above-explained apparatus of the present embodiment can also be subjected to following modifications.

Firstly, the convergent-divergent nozzle 1 may be inclined vertically or horizontally, or may be so constructed as to perform a scanning motion over a certain range to form a film over a lager area. Such inclination or scanning motion is advantageous when combined with the rectangular nozzle shown in FIG. 6C.

It is also possible to form the nozzle 1 with an insulator such as quartz and to supply a microwave thereto, thereby generating active ultra-fine particles therein, or to form the nozzle with a translucent material and to irradiate the flow with light of various wavelength such as ultraviolet light, infrared light or laser light. Also there may be provided plural nozzles 1 to generate plural beams simultaneously. Particularly, the connection of plural nozzles 1 with independent upstream chambers 3 enables to simultaneously generate beams of different fine particles, thereby realizing lamination or mixed capture of different fine particles, or even generation of new fine particles through collisions of crossing beams.

The substrate 6 may be rendered vertically or horizontally movable, or rotatably supported, in order to receive the beam over a wide area. Also the substrate may be unwound and advanced from a roll to receive the beam, thereby subjecting a web-shaped substrate to the treatment with the fine particles. Furthermore the treatment with the fine particles may be applied to a rotating drum-shaped substrate 6.

The above-explained embodiment consists of the upstream chamber 3, first downstream chamber 4a and second downstream chamber 4b, but it is also possible to eliminate the second downstream chamber 4b or to connect additional downstream chamber or chambers to the second downstream chamber. The first downstream chamber 4a may be operated under an open system if the upstream chamber 3 is pressurized, or, the upstream chamber 3 may be operated under an open system if the first downstream chamber 4a is reduced in pressure. It is also possible to pressurize the upstream chamber as in an autoclave and to depressurize the first and ensuing downstream chambers.

Figure 8:
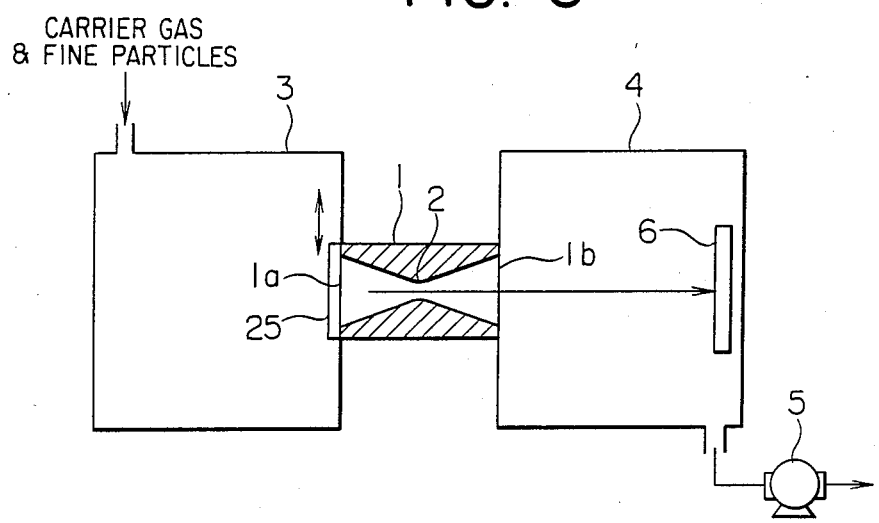
FIG. 8 is a schematic view showing an apparatus provided with nozzle shutter means.

In this embodiment it is also possible to provide shutter means 25, as shown in FIG. 8, for opening or closing the flow path of the convergent-divergent nozzle thereby temporarily storing the fine particles in the upstream chamber 3 and pulsating the ejection from the nozzle by intermittent opening and closing of said shutter means.

Said shutter means can be positioned in front of, behind or in the nozzle, but is preferably positioned in front of the nozzle for fully exploiting the characteristics thereof. Said shutter means can be composed for example of a ball valve or a butterfly valve, but is most preferably of a solenoid valve because of the quick response.

Said shutter means may also be opened and closed in synchronization with the energy supply by the laser beam or irradiation of light of various wavelengths in the throat 2 of the nozzle 1 or in the downstream side thereof, thereby significantly reducing the load of vacuum system, avoiding unnecessary ejection to achieve effective utilization of the raw materials, and obtaining a pulsating flow of the fine particles. Also, for a given vacuum system, the above-mentioned intermittent opening facilitates to achieve a higher degree of vacuum in the downstream side.

In the foregoing explanation the active ultra-fine particles are generated in the upstream chamber 3, but they can also be generated elsewhere and supplied to said chamber together with the carrier gas.

Figure 9:
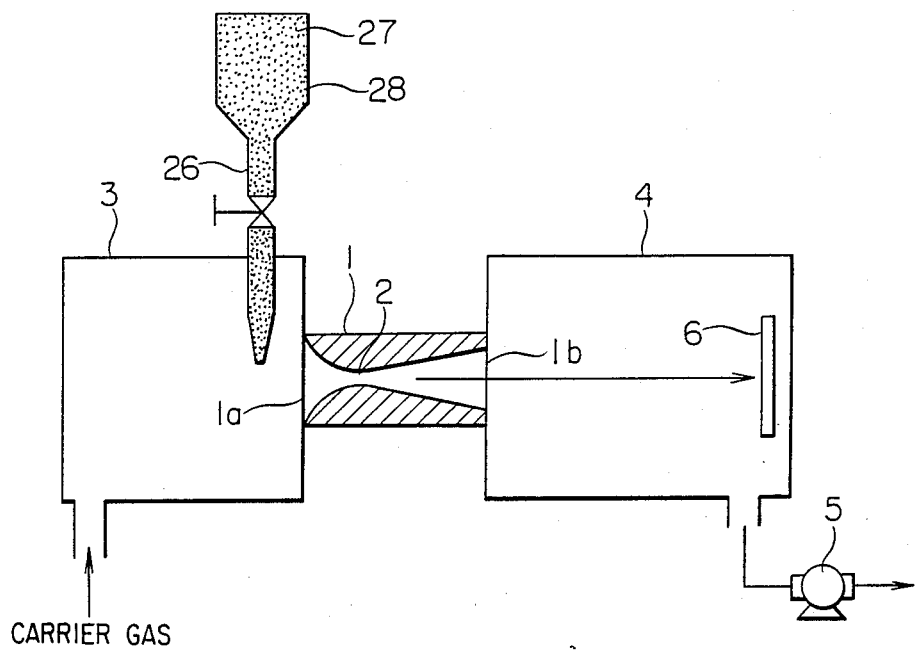
FIG. 9 is a schematic view showing an apparatus provided with a reservoir.

For example, as shown in FIG. 9, a reservoir 28 for temporarily storing the ultra-fine particles may be provided above the upstream chamber 3. The particles are supplied, through a nozzle formed at the end of said reservoir, to the vicinity of the inlet of the convergent-divergent nozzle 1. The inner walls of the upstream chamber 3 may be subjected to a suitable treatment for preventing the deposition of the fine particles. Because the first downstream chamber 4a is in a higher degree of vacuum compared with the upstream chamber 3, the ultra-fine particles supplied from the reservoir 28 immediately flows, together with the carrier gas, to the first downstream chamber 4a through the convergent-divergent nozzle 1.

It is furthermore possible to employ plural nozzles 1 in series and to regulate the pressure ratio between the upstream side and downstream side of each nozzle, in order to maintain a constant beam speed, and to employ spherical chamber to prevent the formation of dead spaces.

In an application of the apparatus of the present invention, the interior of the upstream chamber 3 may be maintained at the atmospheric pressure or higher. If the upstream side is maintained at the atmospheric pressure, the downstream side can be maintained at a lower pressure, and, if the upstream chamber is maintained at a pressure higher than atmospheric pressure, the downstream side can be maintained at the atmospheric pressure or can be pressurized or depressurized in a range not exceeding the pressure of said upstream chamber.

It is therefore possible to obtain a solid reaction product, which is formed in a pressurized liquid phase in the upstream side, without exposure to the atmosphere. Also such reaction product can be condensed in a larger amount under a higher pressure in the downstream side, and can therefore be formed in a high concentration.

According to the present invention, fine particles can be transported as a uniformly dispersed ejection flow or as an supersonic beam. Thus high-speed transportation of fine particles can be achieved in a spatially independent state, and it becomes easier to prevent the loss of fine particles entrained by the discharge in the downstream side. It is also rendered possible to securely transport the active fine particles to the capturing position in the active state, and to exactly control the area of capture by the control of the capturing surface. It is also expected to obtain a new field of reaction, realized by the presence of a beam in the form of an ultra-high speed beam flow, and by the conversion of thermal energy into kinetic energy at the beam formation, to maintain the fine particle in energetically frozen state. Furthermore, utilizing the above-mentioned energetically frozen state, the flow control apparatus of the present invention is capable of defining a microscopic state of the molecules in the fluid to handle a transition from a state to another. More specifically, there is opened a possibility of a novel gaseous chemical reaction in which the molecule is defined to the energy level thereof and is given an energy corresponding to said energy level. There is provided a new field of energy transfer, which can be easily utilized for obtaining intermolecular compounds formed with relatively weak intermolecular forces such as hydrogen bond or van der Waals force. Furthermore, the intermittent irradiation with a light beam is effective also in combination with a process of fine particle generation from a raw material gas by means of excitation with a pulsed laser. Such intermittent irradiation is also effective in case of a light source in which the intensity of the short wavelength range is significantly higher by pulsed drive, such as a mercury lamp.

The ejection may be interrupted when not needed, for example during the movement of the substrate, thus enabling effective utilization of the raw materials or enabling formation of certain patterns.

Furthermore, the gas exciting means employed in the present invention is capable of effective formation of fine particles, since it can uniformly mix the gasses in a pipe and can apply an electric discharge without external diffusion of the gasses.

What is claimed is:

1. Apparatus for bringing fine particles formed from a first substance into contact with a second substance, comprising:
   a convergent divergent nozzle connected between gas supply means and a chamber, the gas supply means being arranged to supply to the nozzle a carrier gas with fine particles of the first substance dispersed therein;
   gas exciting means upstream of said nozzle, said gas exciting means comprising a pair of electrodes with a gas flow space therebetween, and means for creating a DC glow discharge or a high frequency glow discharge between the electrodes; and
   means for regulating pressure conditions upstream and downstream of the nozzle such that a stable beam of the carrier gas with fine particles of the first substance dispersed therein is formed in the chamber and comes into contact with the second substance;
   wherein each electrode of said gas exciting means is semi-circular in cross-section and forms half of a tube, the electrodes being joined to an insulating material to form a tube through which gases may pass.

2. Apparatus according to claim 1, wherein the nozzle is formed from a material which allows the passages of microwaves therethrough.

3. Apparatus according to claim 2, wherein the nozzle is formed of quartz.

4. Apparatus according to claim 1, wherein the nozzle is formed from a material which allows passage of light therethrough.

5. Apparatus according to claim 4, wherein the nozzle is formed from a material which allows passage of ultraviolet or infrared light therethrough.

6. Apparatus according to claim 2, 3, 4 or 5, wherein the second substance is a solid arranged within the chamber such that the beam formed by the nozzle impinges thereon.

7. Apparatus according to claim 1, 2, 3, 4 or 5, further comprising, at the upstream side of said nozzle, a reservoir for storing the fine particles for dispersal in the carrier gas.

8. Apparatus according to claim 1, 2, 3, 4 or 5, further comprising shutter means for said nozzle.

9. Apparatus according to claim 2, 3, 4 or 5, further comprising, at the downstream side of said nozzle, a skimmer having a variable aperture function which can be externally regulated to vary aperture area between open and closed positions.

10. Apparatus according to claim 1, 2, 3, 4 or 5, wherein said means for regulating is operable in cooperation with said gas supply means to form a film of the first substance on a substrate.

11. A method of bringing fine particles formed from a first substance into contact with a second substance, comprising:
    supplying a carrier gas under pressure with fine particles of the first substance dispersed therein to a convergent-divergent nozzle;
    regulating the pressure conditions upstream and downstream of the nozzle such that a stable beam of the carrier gas, having dispersed therein fine particles of the first substance, is formed downstream of the nozzle; and
    causing the fine particles in the stable beam to contact the second substance;
    wherein the first substance is gaseous and is treated before passage through the nozzle to produce active particles, the active particles being produced by passing the carrier gas and the first substance through gas exciting means upstream of the nozzle.
    the gas exciting means comprising a pair of electrodes between which the gases pass, and means for creating a DC glow discharge or a high frequency glow discharge between the electrode; and
    wherein each electrode is semi-circular in cross-section and forms half of a tube, the electrodes being joined to an insulating material to form a tube through which the gases pass.

12. A method according to claim 11, wherein the first substance is exposed to activating energy passing through the walls of the nozzle to produce active particles.

13. A method according to claim 12, wherein the nozzle is formed from a material which allows the passage of microwaves therethrough.

14. A method according to claim 13, wherein the nozzle is formed of quartz.

15. A method according to claim 12, wherein the nozzle is formed from a material which allows the passage of light therethrough.

16. A method according to claim 15, wherein the activating energy comprises laser light.

17. A method according to claim 15, wherein the nozzle is formed from a material which allows the passage of ultraviolet or infrared light therethrough.

18. A method according to claim 11, 12, 13, 14, 15, 16 or 17, wherein the first substance is gaseous and the fine particles are formed by condensing the gaseous first substance in the nozzle to form ultra fine particles dispersed in the carrier gas.

19. A method according to claim 11, 12, 13, 14, 15, 16 or 17, further comprising the step of forming a film of the first substance on a substrate.

20. Apparatus for bringing fine particles formed from a first substance into contact with a second substance, comprising:
- a convergent divergent nozzle connected between gas supply means and a chamber, the gas supply means being arranged to supply to the nozzle a carrier gas with fine particles of the first substance dispersed therein; and
- means for regulating pressure conditions upstream and downstream of the nozzle such that a stable beam of the carrier gas with fine particles of the first substance dispersed therein is formed in the chamber and comes into contact with the second substance;
- wherein the second substance is a solid arranged within the chamber such that the beam formed by the nozzle impinges thereon.

21. Apparatus for bringing fine particles formed from a first substance into contact with a second substance, comprising:
- a convergent divergent nozzle connected between gas supply means and a chamber, the gas supply means being arranged to supply to the nozzle a carrier gas with fine particles of the first substance dispersed therein; and
- means for regulating pressure conditions upstream and downstream of the nozzle such that a stable beam of the carrier gas with fine particles of the first substance dispersed therein is formed in the chamber and comes into contact with the second substance;
- further comprising, at the downstream side of said nozzle, a skimmer having a variable aperture function which can be externally regulated to vary aperture area between open and closed positions.

22. Apparatus according to claim 20 or 21, wherein the nozzle is formed from a material which allows the passage of microwaves therethrough.

23. Apparatus according to claim 22, wherein the nozzle is formed of quartz.

24. Apparatus according to claim 20 or 21, wherein the nozzle is formed from a material which allows passage of light therethrough.

25. Apparatus according to claim 24, wherein the nozzle is formed from a material which allows passage of ultraviolet or infrared light therethrough.

* * * * *

UNITED STATES PATENT AND TRADEMARK OFFICE
CERTIFICATE OF CORRECTION

PATENT NO. : 4,911,805

DATED : March 27, 1990

INVENTOR(S) : KENJI ANDO ET AL.

It is certified that error appears in the above-identified patent and that said Letters Patent is hereby corrected as shown below: ON TITLE PAGE:

AT [56] REFERENCES CITED

Foreign Patent Documents, "14034306 5/1965 France" should read --1404306 5/1965 France--.
Other Publications, "Lehrbuchder" should read --Lehrbuch der--.

COLUMN 1

Line 18, "atoms" should read --atoms,--.

COLUMN 5

Line 4, "t" should read --at--.
Line 29, "flow rat" should read --flow rate--.
Line 67, "particle" should read --particles--.

COLUMN 6

Line 35, "be" (second Occur.) should read --by--.

COLUMN 11

Line 65, "chamber" should read --chamber 3--.

COLUMN 13

Line 67, "passages" should read --passage--.

UNITED STATES PATENT AND TRADEMARK OFFICE
CERTIFICATE OF CORRECTION

PATENT NO. : 4,911,805

DATED : March 27, 1990

INVENTOR(S) : KENJI ANDO ET AL.

It is certified that error appears in the above-identified patent and that said Letters Patent is hereby corrected as shown below:

COLUMN 14

Line 46, "nozzle." should read --nozzle,--.
Line 50, "electrode;" should read --electrodes;--.

Signed and Sealed this

Eighteenth Day of February, 1992

Attest:

HARRY F. MANBECK, JR.

*Attesting Officer*   *Commissioner of Patents and Trademarks*